United States Patent [19]

Rinaldi

[11] 4,446,437

[45] May 1, 1984

[54] PULSE MONITOR CIRCUIT

[75] Inventor: Gerald M. Rinaldi, Mundelein, Ill.

[73] Assignee: GTE Automatic Electric Labs Inc., Northlake, Ill.

[21] Appl. No.: 333,220

[22] Filed: Dec. 21, 1981

[51] Int. Cl.³ .................... H03K 5/19; H03K 5/26
[52] U.S. Cl. .................... 328/120; 307/442; 307/518; 307/526; 307/269
[58] Field of Search ............ 307/441, 442, 269, 510, 307/518, 525, 526; 328/120

[56] References Cited

U.S. PATENT DOCUMENTS 3,628,158 12/1971 Sjoquist .................... 307/442
3,795,867 3/1974 Jones, Jr. .................... 328/120
4,342,112 7/1982 Stodola .................... 328/120

Primary Examiner—John Zazworsky
Attorney, Agent, or Firm—Gregory G. Hendricks; Robert J. Black

[57] ABSTRACT

A pulse monitor circuit which detects failure of a monitored pulse by monitoring its expected occurrence during time intervals defined by an external reference pulse train. Failure of the reference pulse train is detected by monitoring its expected occurrence during time intervals derived from the monitored pulse train. Detection circuits are used to detect failure of the pulse trains and storage circuits, which can be cleared by external control or reappearance of the monitored pulse.

14 Claims, 1 Drawing Figure

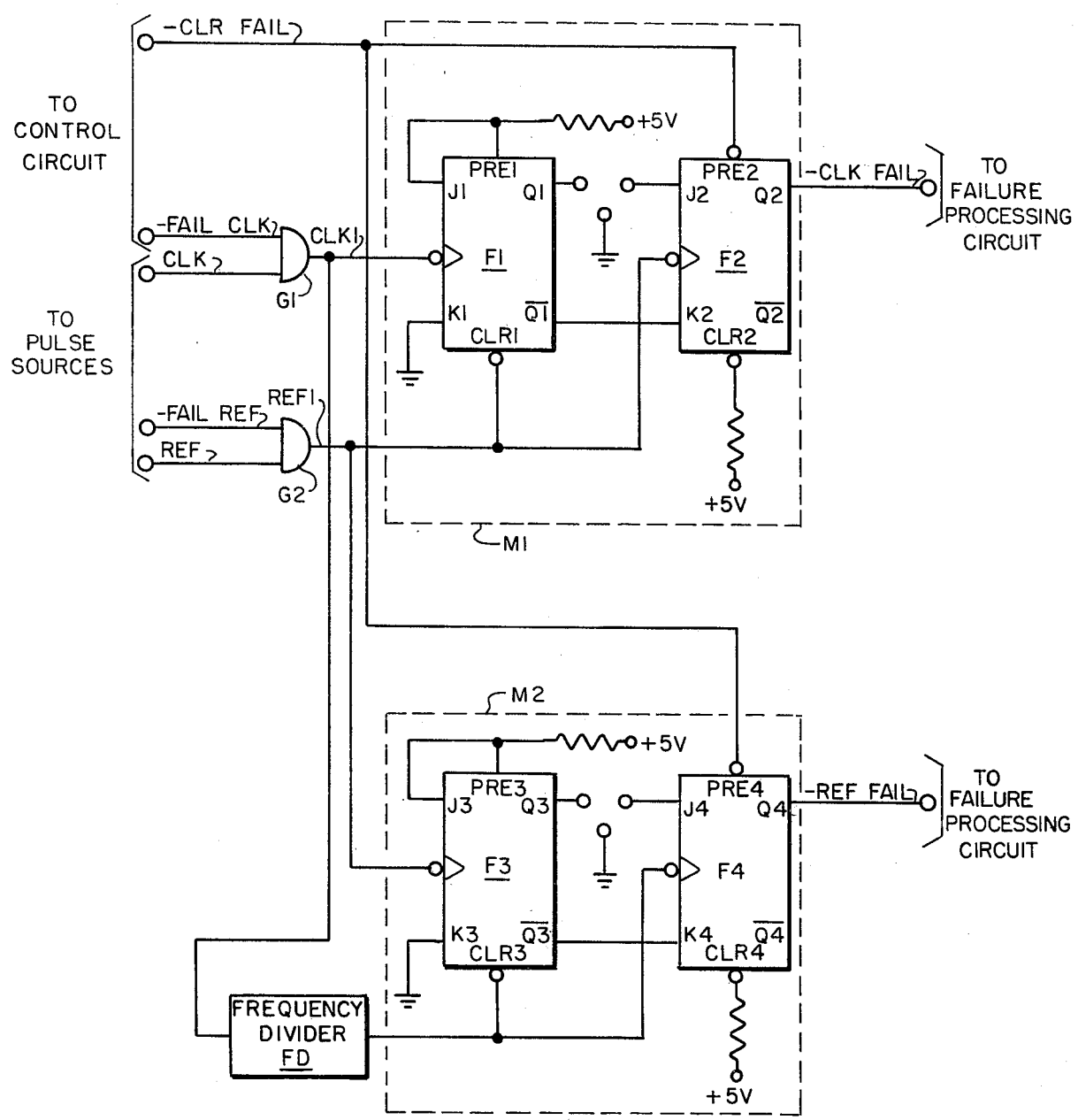

PULSE MONITOR CIRCUIT

BACKGROUND OF THE INVENTION

1. Field of the Invention

The present invention relates to digital switching systems and more particularly to a pulse monitor circuit for use in such systems.

2. Description of the Prior Art

Typical digital pulse monitor circuits require complex logic circuitry and often are unreliable and subject to race conditions. A recent advancement in the state of the art was disclosed by H. Ballentine in an article entitled "Clock-Activity Detector Uses One DIP", Electronic Design News, Jan. 5, 1980, page 156. However this circuit is subject to the following problems; potential race conditions for some circuit implementations due to insufficient clear pulse widths; any detected failure signal is cleared when the monitored pulse signal reappears; and it is unable to detect reference signal failures.

Accordingly it is the object of the present invention to provide a minimum component, highly reliable pulse monitor circuit, free of any potential race problems, resettable by either an external clear signal or reappearance of the monitored pulse, and capable of detecting failures of both the monitored and reference pulse signals.

SUMMARY OF THE INVENTION

The present invention is a circuit which detects the occurrence of monitored clock pulses during time intervals defined by an external reference pulse train. This circuit also detects failures of the reference pulse signals by monitoring the occurrence of reference pulse signals during time intervals derived from the clock pulse signals. Thus, thiscircuit comprises two sections, namely, a clock pulse monitor section and a reference pulse monitor section.

In the clock pulse monitor section the external reference signal clocks a storage circuit, while a detection circuit is clocked in response to monitored pulses. The detection circuit is also reset by he external reference signal.

The frequency of the reference clock pulses is less than half the frequency of the monitored clock pulses. This ratio guarantees that at least one monitored clock pulse edge occurs for each reference pulse.

If a monitored clock pulse edge occurs during the reference pulse the detection circuit switches to a set state. Its output signals are then transferred into the storage circuit when that circuit is clocked by the trailing edge of the reference pulse. This storage circuit then provides a clock detected signal.

If the monitored pulse does not appear during the reference pulse, the detection circuit does not switch out of the reset state. Its output signals are then transferred to the storage circuit when that circuit is clocked by the trailing edge of the reference pulse. The storage circuit then provides a clock failure signal.

In one mode of operation, the clock failure condition is latched and the storage circuit thus provides a failure indication even if the monitored clock pulse signal reappears. Therefore, a failure condition can only be reset by an external clear signal. In an alternate mode of operation the clock failure condition is not latched. Therefore an external clear signal is not required since the failure condition will be cleared when the monitored pulse reappears.

Similarly, the reference pulse monitor section detects failure of the reference. This insures that the absence of a monitored pulse failure signal is not due to the absence of a reference signal. The circuitry of this section is identical to that of the clock pulse monitor section. However, in this section the reference signal is applied to the clock input of the detection circuit and the reference signal for this section is a frequency divided version of the monitored clock pulse signal. The frequency of the frequency divided signal is less than half the frequency of the reference pulse signal and therefore less than one-fourth the frequency of the monitored clock pulse signal. This ratio guarantees that at least one reference pulse edge occurs for each frequency divided pulse.

DESCRIPTION OF THE DRAWING

The single FIGURE of the accompanying drawing is a logic diagram of a pulse monitor circuit in accordance with the present invention.

DESCRIPTION OF THE PREFERRED EMBODIMENT

Referring now to the accompanying drawing, the pulse monitor circuit of the present invention is shown. This circuit includes pulse monitor M1 which operates to detect failures in the monitored clock pulse train (CLK), and pulse monitor M2 which operates to detect failures in the reference pulse train (REF). These pulse trains are provided by external pulse sources.

If a failure is detected in the CLK pulse train a clock pulse failure (−CLK FAIL) signal is generated by monitor M1. Similarly, if a failure is detected in the REF pulse train, a reference pulse failure (−REF FAIL) signal is generated by monitor M2. By monitoring the reference REF pulse train, monitor M2 insures that an absence of a monitored clock pulse failure (−CLK FAIL) signal is not due to a failure of the REF signal.

For monitor M1, the frequency of the reference pulse train REF is chosen to be less than half the frequency of the monitored clock pulse train CLK. This guarantees that a least one negative CLK pulse edge occurs during the high time of the REF signal. Similarly, the reference signal for monitor M2 must also have a frequency less than half the frequency of its clock signal (REF), in order to guarantee that at least one REF pulse occurs during the high time of its reference signal. If the CLK signal is n times the frequency of the REF signal (n>2), dividing the CLK signal by something greater than 2n, results in the signal having a frequency less than half the frequency of the REF signal. Therefore, by applying the CLK signal to an appropriate frequency divider FD, this frequency divider provides monitor M2 with reference signal REF 2 of the desired frequency.

Referring now to the circuitry of pulse monitor M1, the $\overline{Q1}$ output of flip-flop F1 (detection means) is shown connected to the K2 input of flip-flop F2. Input J2 is shown connectable to either the Q1 output of flip-flop F1 or to ground. The inputs, J1 and K1 of flip-flop F1 are shown connected to 5V and ground respectively. The clear input of flip-flop F1 and a negative edge triggered clock input of flip-flop F2 are shown connected to an external reference (REF) pulse source. The negative edge triggered clock input of flip-flop F1 is then connected to the monitored clock pulse (CLK) source via AND gate G1. This gate is also shown connected to an external clock failure (−FAIL CLK) routing control circuit. The preset input of flip-flop F2 (storage means) is shown connected to an external clear signal (−CLR FAIL) control circuit while the Q2 output of flip-flop F2 provides a clock failure (−CLK FAIL) signal.

The frequency of the REF pulse signal is chosen to be less than half the frequency of the monitored CLK signal. This ratio guarantees that, during normal operation, at least one negative going CLK pulse edge occurs during the high time of the REF signal.

To initialize this circuit a logic level 0 clear signal (−CLR FAIL) is applied to the preset input of storage flip-flop F2. This causes flip-flop F2 to clear the failure detected signal (−CLK FAIL) by driving its Q2 output to a logic level 1. During normal operations, the routing control signals (−FAIL CLK and −FAIL REF) are at a logic level 1. Therefore, the monitored CLK pulse is normally applied by gate G1 to the clock input of flip-flop F1, and frequency divider FD. Similarly, reference signal REF is normally applied to the clock input of flip-flops F2 and F3 and the clear input of flip-flop F1. When a negative going edge of a monitored CLK pulse appears at the clock input of flip-flop F1 the logic level 1 and 0 signals, at the J1 and K1 inputs, are transferred to the Q1 and $\overline{Q1}$ outputs, respectively, of flip-flop F1. When the negative going edge of a REF pulse subsequently appears at the clear input of flip-flop F1 it causes this flip-flop to reset. However, since the REF pulse simultaneously appears at the clock input of flip-flop F2, this flip-flop responds to the signals appearing at its inputs before flip-flop F1 is reset. Both flip-flops have a zero hold time requirement for data appearing at the J and K inputs with respect to a negative clock edge.

If the J2 input is connected to the Q1 output the logic level 1 and 0 signals at the Q1 and $\overline{Q1}$ outputs appear at the J2 and K2 inputs respectively. When the negative going edge of a REF pulse subsequently appears at the clock input of flip-flop F2, these logic level 1 and 0 signals are clocked into flip-flop F2 and a logic level 1 signal again appears at the Q2 output.

If the J2 input is connected to ground, logic level 0 signals appear at both the J2 and K2 inputs. With this arrangement, when the negative going edge of a REF pulse appears at the clock input of flip-flop F2, the logic level 1 signal at the Q2 output again remains unchanged, since flip-flop F2 does not switch when logic level 0 signals appear at its J2 and K2 inputs. Thus the absence of a failure condition is maintained since the −CLK FAIL signal remains at a logic level 1 as long as a negative going monitored CLK pulse edge occurs during the high time of the REF signal.

If the CLK pulse fails, flip-flop F1, after being reset by the REF pulse, remains reset with logic level 0 and 1 signals on its Q1 and $\overline{Q1}$ outputs respectively.

If the J2 input is connected to the Q1 output these logic level 0 and 1 signals appear at the J2 and K2 inputs respectively. When the negative going edge of a REF pulse subsequently appears at the clock input of flip-flop F2, it switches state and a logic level 0 signal appears at its Q2 output. Thus the failure condition is detected since the −CLK FAIL signal is at a logic level 0. In this configuration, the failure condition can be cleared upon reappearance of a CLK pulse. If a CLK pulse does reappear logic level 1 and 0 signals appear at the Q1 and $\overline{Q1}$ outputs respectively. Therefore, these signals also appear at the J2 and K2 inputs. Consequently, flip-flop F2 switches out of the failure state and the −CLK FAIL signal returns to a logic level 1.

If the J2 input is connected to ground, logic level 0 and 1 signals still appear at the Q1 and $\overline{Q1}$ outputs when a CLK pulse fails. However, only the K2 input responds to a signal from flip-flop F1 since a logic level 0 signal (ground) constantly appears at the J2 input. With this arrangement, when the negative going edge of a REF pulse appears at the clock input of flip-flop F2, it switches state and a logic level 0 signal appears at its Q2 output. Thus the failure condition is again detected since the −CLK FAIL signal is again at a logic level 0. However, in this configuration, the failure condition can only be cleared by a logic level 0 external clear signal −CLR FAIL applied to the preset input of flip-flop F2. Reappearance of a CLK pulse will not clear the failure condition. It will cause flip-flop F1 to set, but this only results in logic level 0 signals being applied to the J2 and K2 inputs since J2 is connected to ground and a logic level 0 signal appears at K2 via $\overline{Q1}$. Flip-flop F2 will not switch under such conditions and therefore the failure condition is not cleared.

Gate G1 provides a means for routing pulse monitor M1 since it allows for the simulation of a monitored CLK pulse failure condition. This routing occurs when a logic level 0 (−FAIL CLK) signal appears at the first input of gate G1. Similarly, gate G1 provides a means for routing pulse monitor M2 since it allows for the simulation of REF pulse failure condition.

The structure and operation of monitor M2 is identical to that of monitor M1, except for the use of different clock and reference signals. Therefore the previous description of the operation of monitor M1 also applies to the operation of monitor M2.

The present invention thus discloses a highly reliable, minimum component, pulse monitor circuit which is not susceptible to react conditions, is capable of detecting failure of both the clock and reference signals, and can be reset by either an external clear signal or reappearance of the monitored clock or reference signals.

What is claimed is:

1. A pulse monitor circuit for use in a switching system, including a reference signal source which is normally operated to provide reference signal pulses of first and second polarities and of a first frequency, said reference signal source being abnormally operated to inhibit said reference signal pulses, and a clock signal source which is normally operated to provide clock signal pulses of first and second polarities and of a second frequency, said clock signal sources being abnormally operated to inhibit said clock signal pulses, said pulse monitor circuit comprising:

clock monitor means connected to said clock signal source and said reference signal source, operated in response to a reference signal pulse of said first polarity and an absence of a clock signal pulse to provide a clock failure signal;

frequency division means, connected to said clock signal source, operated to divide said first frequency of said clock signal pulses by a predetermined amount, whereby said frequency division means provides frequency divided clock signal pulses having first and second polarities and a third frequency less than said first frequency of said reference signal; and reference monitor means, connected to said reference signal source and said frequency division means, operated in response to a frequency divided clock signal pulse of said first polarity and an absence of a reference signal pulse to provide a reference failure signal.

2. A pulse monitor circuit as claimed in claim 1, wherein there is further included: a clear signal source, said clock monitor means and said reference monitor means each further connected to said clear signal source and each further operated in response to said clear signal to clear said clock failure and reference failure signals, respectively.

3. A pulse monitor circuit as claimed in claim 1, wherein there is further included, a clock routing signal source, said pulse monitor circuit further comprising: gating means connected to said clock signal source and said clock routing signal source, operated in response to said clock routing signal to inhibit said clock signal.

4. A pulse monitor circuit as claimed in claim 1, wherein there is further included, a reference routing signal source, said pulse monitor circuit further comprising: gating means connected to said reference signal source and said reference routing signal source, operated in response to said reference routing signal to inhibit said reference signal.

5. A pulse monitor circuit as claimed in claim 1, wherein said clock monitor means comprises:
   detection means connected to said clock signal source and said reference signal source, operated in response to said reference signal pulse of said first polarity and an absence of said clock signal pulse to provide a clock failure detected signal;
   said detection means furthe operated in response to said reference signal pulse of said second polarity to clear said clock failure detected signal; and
   storage means connected to said detection means and said reference signal source, operated in response to said reference signal pulse of second polarity and said clock failure detected signal to provide said clock failure signal.

6. A pulse monitor circuit as claimed in claim 1, wherein said reference monitor means comprises:
   detection means connected to said reference signal source and said frequency division means, operated in response to said frequency divided clock signal pulse of said first polarity and an absence of said reference signal pulse to provide a reference failure detected signal;
   said detection means further operated in response to said frequency divided clock signal pulse of said second polarity toclear said reference failure detected signal; and
   storage means connected to said detection means and said frequency division means, operated in response to said frequency divided clock signal pulse of second polarity and said reference failure detected signal to provide said reference failure signal.

7. A pulse monitor circuit as claimed in claim 5, wherein: said storage means is further operated in response to said reference signal pulse of second polarity and an absence of said clock failure detected signal to clear said clock failure signal.

8. A pulse monitor circuit as claimed in claim 6, wherein: said storage means is further operated in response to said frequency divided clock signal pulse of second polarity and an absence of said reference failure detected signal to clear said reference failure signal.

9. A pulse monitor circuit as claimed in claim 5, wherein said detection means comprises: a flip-flop having a clock input connected to said clock signal source and a clear input connected to said reference signal source.

10. A pulse monitor circuit as claimed in claim 6, wherein said detection means comprises: a flip-flop having a clock input connected to said reference signal source and a clear input connected to said frequency division means.

11. A pulse monitor circuit as claimed in claim 5, wherein said storage means comprises: a flip-flop having a clock input connected to said reference signal source, a first data input connected to ground and a second data input connected to said detection means.

12. A pulse monitor circuit as claimed in claim 6, wherein said storage means comprises: a flip-flop having a clock input connected to said frequency division means and a first data input connected to ground and a second data input connected to said detection means.

13. A pulse monitor circuit as claimed in claim 7, wherein said storage means comprises: a flip-flop having a clock input connected to said reference signal source and first and second data inputs connected to said detection means.

14. A pulse monitor circuit as claimed in claim 8, wherein said storage means comprises: a flip-flop having a clock input connected to said frequency division means and first and second data inputs connected to said detection means.

* * * * *